United States Patent [19]

Canup

[11] 4,320,735

[45] Mar. 23, 1982

[54] HIGH-FREQUENCY CONTINUOUS-WAVE IGNITION SYSTEM

[75] Inventor: Robert E. Canup, Poughkeepsie, N.Y.

[73] Assignee: Texaco, Inc., White Plains, N.Y.

[21] Appl. No.: 152,946

[22] Filed: May 23, 1980

[51] Int. Cl.³ ........................ F02P 3/02; H03K 17/72; F02P 1/00

[52] U.S. Cl. .................................... 123/606; 123/607; 123/651; 123/652; 307/252 C; 307/305; 315/209 SC; 331/111

[58] Field of Search ............... 123/651, 652, 605, 606, 123/607, 618, 619, 630, 648; 307/252 C, 305; 315/209 SC; 331/111

[56] References Cited

U.S. PATENT DOCUMENTS

| | | | |
|---|---|---|---|
| 3,792,695 | 2/1974 | Canup | 123/606 |
| 3,961,613 | 6/1977 | Canup | 123/606 |
| 4,016,433 | 4/1977 | Brooks | 123/651 |
| 4,084,566 | 4/1978 | Weiler | 123/651 |
| 4,097,770 | 6/1978 | Fisher | 123/605 |
| 4,109,632 | 8/1978 | Brooks | 123/619 |

*Primary Examiner*—Raymond A. Nelli
*Attorney, Agent, or Firm*—Carl G. Ries; Robert A. Kulason; Henry C. Dearborn

[57] ABSTRACT

An ignition system that develops continuous-wave high-frequency spark signals. It employs a square wave oscillator which uses a unitary magnetic circuit and includes a control winding that acts to start and stop the oscillator. The control winding has a gate-turn-off type silicon controlled rectifier in circuit with it, which provides superior control action.

3 Claims, 1 Drawing Figure

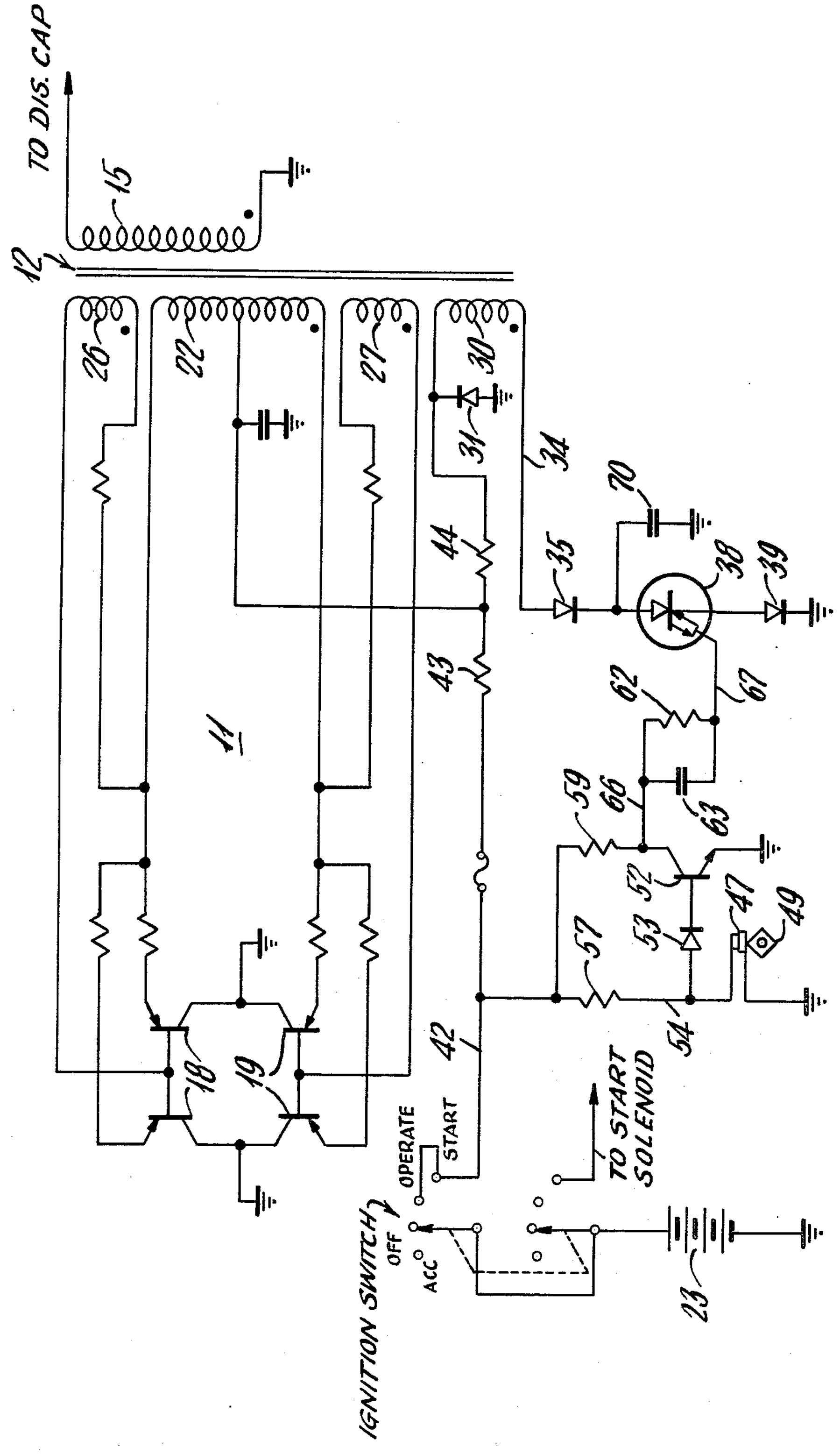
TO DIS. CAP
15
12
26
22
27
30
31
34
70
44
35
38
39
43
62
67
11
59
66
63
52
53
47
49
57
42
54
18
19
OPERATE
START
TO START SOLENOID
IGNITION SWITCH
OFF
ACC
23

HIGH-FREQUENCY CONTINUOUS-WAVE IGNITION SYSTEM

BACKGROUND OF THE INVENTION

1. Field of the Invention

This invention concerns ignition systems for internal combustion engines, in general. More specifically, it relates to an improvement for a particular type of ignition system that employs high-frequency continuous-wave spark energy. The improvement relates to an aspect of the control for such an ignition system. The control involves the use of a control winding for starting and stopping the oscillation of a square wave oscillator, which produces the indicated high-frequency continuous-wave spark energy.

2. Description of the Prior Art

A highly successful ignition system has been developed which employs a single transformer, and makes use of a high-frequency continuous-wave signal that is delivered to the spark plugs. It has a controlled duration that may be determined in various manners, and it ensures a superior spark signal at each of the cylinders. Such an ignition system is exemplified by the U.S. Pat. No. 3,961,613, issued June 8, 1976. Also, there are additional patents that show and describe the same basic type of superior ignition system that is of concern here. However, it has been found that because the control winding of those ignition systems was being controlled by a transistor acting as an electronic switch, the current and/or power requirements created the need for a very expensive transistor in order to have the necessary power rating.

The aforementioned electronic control of the indicated type of ignition system made use of what may be described as a series pass transistor. It acted in series with a control winding on the above indicated single transformer which was a high voltage power type that delivered the spark signals. During the off state of the high-frequency continuous-wave spark signals, a DC current flowed through the control winding and the series pass transistor to ground. Then when a spark signal was required a high voltage oscillator was turned on by stopping the flow of the DC current through the control winding. The consequent decaying magnetic flux was sufficient to start the oscillator. Stopping the DC current flow was accomplished by turning off the series pass transistor. The oscillator would continue to run as long as the series pass transistor was off, and it would develop an AC voltage in the control winding. But, when the series pass transistor was off no current flowed in the control winding, either AC or DC.

At the end of a spark signal the oscillator would be stopped by turning on the series pass transistor. That would allow both the DC current from the battery and AC current from the oscillator action, to flow. The AC current flow would be sufficient to overload the oscillator and cause the oscillation to cease.

In a system such as just described, the starting of the oscillator reliably, required a certain amount of DC flux to be present in the transformer core when the circuit was broken. That flux is proportional to the current times the number of turns in the control winding. If the current was large, then the current drain on the battery was at a high level during the times when the oscillator was not oscillating. On the other hand, if the number of turns in the control winding was large, then a large AC voltage would be generated in this winding while the oscillator was running. Such voltage would appear at the collector of the series pass transistor. And if that voltage was too large, the breakdown voltage of the transistor would be exceeded and the transistor would fail.

In the foregoing type system, in order to stop the oscillator, it was necessary to draw enough power into the control winding circuit to reduce the loop gain of the oscillator to less than a gain of one. That required the control winding to be essentially short circuited. And since there was a high voltage present at the collector of the series pass transistor when it was turned on, a very large current would flow momentarily. Also, if the series pass transistor was capable of handling the large current surge, the oscillator would shut down. However, if the oscillator did not shut down on the first current surge, the oscillator would continue to run and cause the transistor to draw repetitive high surges of current which would soon destroy it.

Thus, it has been found that a series pass transistor in the foregoing system had to be capable of withstanding about 300–400 volts on the collector while off, and to handle current surges of about 10–50 amperes. So a transistor meeting such requirements was very expensive.

Consequently, it is an object of this invention to improve a particular ignition system that has a superior AC spark signal.

There is a U.S. Pat. to Fisher No. 4,097,770 issued June 27, 1978, that discloses a triggering circuit for a silicon controlled rectifier. However, it is applied to a capacitor discharge type of automobile ignition system, and consequently is not relevant to the applicant's invention.

SUMMARY OF THE INVENTION

The invention concerns an improvement that is in combination with a high-frequency continuous-wave ignition system for an internal combustion engine. The said system includes a square wave oscillator employing a unitary magnetic circuit and it includes a control winding for starting and stopping said high-frequency continuous-wave energy to generate a continuous AC spark whenever said oscillator is oscillating. The said system also includes means for timing said AC spark duration intervals, relative to said engine. The improvement comprises high current means for applying a low impedance path to said control winding concurrently with DC current therethrough between each said spark duration interval.

Again briefly, the invention relates to an improvement that is in combination with a high-frequency continuous-wave ignition system for an internal combustion engine. The said system includes a square wave oscillator employing a unitary magnetic circuit and including a control winding for starting and stopping said high-frequency continuous-wave energy, to generate a continuous AC spark whenever said oscillator is oscillating. The said system also includes means for timing said AC spark duration intervals relative to said engine. The improvement comprises a gate turn-off type silicon controlled rectifier for applying a low impedance path to said control winding concurrently with a DC current therethrough, between each said spark duration interval. And, said spark duration timing means comprises engine timed means for controlling the conductive state of a transistor. There is a resistor and capacitor connected in parallel with one end connected to the gate of said gate controlled rectifier, and the other end connected to said transistor for grounding that end when said transistor is conducting. It also comprises circuit means for connecting said engine timed means to the base of said transistor.

BRIEF DESCRIPTION OF THE DRAWING

The foregoing and other objects and benefits of the invention will be more fully set forth below in connection with the best mode contemplated by the inventor of carrying out the invention, and in connection with which there are illustrations provided in the drawing, wherein;

The FIGURE of drawings is a schematic circuit diagram, illustrating an ignition system with the control element according to this invention shown therein.

DESCRIPTION OF THE PREFERRED EMBODIMENT

With reference to the FIGURE of drawings, it is to be noted that there is illustrated a high-frequency continuous-wave ignition system which is a known type. It is substantially like the ignition systems shown and described in a number of issued U.S. patents, e.g. U.S. Pat. No. 3,961,613, issued June 8, 1976. Thus, the ignition system illustrated includes a relatively high-frequency square wave oscillator 11. It employs a unitary magnetic circuit which includes a transformer 12 that has an output winding 15. The latter delivers AC spark signals to the spark plugs (not shown) of an internal combustion engine, by having one end of the winding 15 connected to a distributor (not shown) as indicated by the caption "To Dis.Cap". The other end of the winding 15 is grounded, as indicated.

The oscillator 11 includes two pairs of transistors 18 and 19 which are connected in the oscillator circuit with the collector electrodes grounded. The emitter electrodes are connected to the ends of a center tapped winding 22. The center tap of winding 22 is connected to a power source by the indicated circuit connections. These connections go through an ignition switch (see the caption) which connects a source of power, e.g. a battery 23 to the oscillator 11 when the ignition switch is turned on. The oscillator 11 includes feedback windings 26 and 27 that have one end of each connected to the base electrodes of the transistors 18 and 19, respectively.

The oscillator 11 is part of a superior ignition spark signal generating system like the known type indicated above. It employs a control winding 30 that acts to start and stop the oscillator 11. Such control is carried out in the manner that is clearly described in the various earlier patents mentioned above. The action involves keeping the oscillator non-oscillating during the times when no spark signal is desired. That is done by having an AC short circuit on the control winding 30. Such short circuit includes a diode 31 that has one side grounded and is connected to one end of the winding 30, while the other end of winding 30 goes via a circuit connection 34 to another diode 35 and then via an electronic switch element 38 to another diode 39 that has the other side thereof grounded.

At the same time, there is a DC current which flows through the control winding 30 during the non-oscillating time of oscillator 11. This DC is employed to act on the magnetic circuit of the transformer 12 for starting the oscillator 11 instantaneously at the desired time. This is accomplished by cutting off the DC current flow.

The foregoing current flows over a path that leads from battery 23 and goes over a circuit connection 42. Then it goes via resistors 43 and 44 to one end of winding 30, and then from the other end via the circuit connection 34 and the diode 35 plus the electronic switch element 38 and the other diode 39 to ground. From the ground connection, the circuit is completed via ground to the other end of the battery 23.

Heretofore, a known type ignition system in accordance with the description above, employed a transistor to act as an electronic switch element in circuit with the control winding to start and stop the oscillator. However, it was found that the current and voltage requirements of such switch were such that it was difficult to have the system work properly. Thus, the aforementioned requirements of high voltage and/or high current required a very expensive transistor, and even so it was subject to short life or breakdown.

However, it has been discovered that a silicon controlled rectifier type switch may be employed, and it will act to overcome the prior difficulties. Such a switch is known as a gate-turn-off type of silicon controlled rectifier.

The spark duration timing, i.e. the control of the oscillation of oscillator 11, is determined by having an engine timed means to control the conductive and nonconductive state of the electronic switch element 38. Thus, while different type of engine timed means may be employed to develop the required control signals, the system illustrated employs a pair of breaker points 47 that are actuated by an engine driven cam 49.

In the illustrated system, the breaker points 47 are connected into the control circuit of a transistor 52. Also, there is a diode 53 connected between a circuit connection 54 and the base electrode of transistor 52. The circuit connection 54 goes from the breaker points 47 to one end of a resistor 57. The other end of resistor 57 is connected into the circuit connection 42 that leads to the battery 23.

The transistor 52 has the collector electrode thereof connected via a resistor 59 to the battery 23 via the circuit connection 42, while the emitter electrode of transistor 52 is connected to ground as indicated. There is a resistor 62 and a capacitor 63 that are connected in parallel. One end of that pair of elements is connected to the collector electrode of transistor 52 via a circuit connection 66. And, the other end of the parallel resistor 62 and capacitor 63, is connected to the gate of the electronic switch element 38, which is a gate-turn-off type of silicon controlled rectifier.

OPERATION

The system operation is such that during the time when no spark signal is required from the output winding 15 of transformer 12, the electronic switch element 38, i.e. the gate-turn-off type of silicon controlled rectifier is conducting and the control winding 30 is maintained with a short circuit for AC signals as well as having a DC current flow therethrough. Under these conditions the transistor 52 is off (non-conductive) and there is current flow from the battery 23 via the circuit connection 42 and resistors 59 and 62 into the gate of the silicon controlled rectifier 38 via the circuit connection 67. Such current flow is sufficient to have the gate-turn-off switch element 38 regenerative, and consequently it will be turned on so that the indicated conditions will obtain, i.e. having DC current flow from the battery through the winding 30 and maintaining an AC short circuit via the turned-on silicon controlled rectifier 38.

When a spark is required, the transistor 52 is turned on (made conducting) by having the breaker points 47 open. This applies high voltage to the base electrode of transistor 52 via the diode 53. Turning on of the transistor 52 will pull the voltage at the junction between resistor 59 and resistor 62 (i.e. at circuit connection 66) essentially to ground or zero. Then, since the cathode of the silicon controlled rectifier 38 is approximately 0.7 volts above ground (which is caused by the forward voltage drop across the diode 39), the gate of the element 38 is pulled negative which helps turn off the gate controlled rectifier 38. In addition, when the transistor 52 is turned on, the capacitor 63 discharges from a plus voltage to ground. This discharges the left side of the capacitor 63, i.e. the side connected to circuit connection 66, which causes a negative pulse to appear on the other side and thus at the gate of the gate-turn-on silicon controlled rectifier 38, via the circuit connection 67. The combination of the negative pulse on the circuit connection 67 and the forward bias on the diode 39 will turn off the control current flowing through the gate of the silicon controlled rectifier 38.

Turning off the current flow through control winding 30 starts the oscillator 11 in the manner known for this type of ignition system, that is already indicated above. The negative portions of the AC voltage which exists in the control winding 30 will be prevented from reaching the anode of the gate-turn-off silicon control rectifier 38 by the diode 35, so that only a positive voltage will appear at the anode. There is a capacitor 70 which filters the AC ripple so that essentially pure DC is present at the anode of the silicon controlled rectifier 38 while the oscillator is running.

When it is desired to stop the oscillator 11, the transistor 52 is turned off which causes the voltage at the connection 66 to go positive, and a positive pulse is transmitted to the gate of the electronic switch 38 via the circuit connection 67. Such pulse is caused by the charging of the capacitor 63. At the same time, a steady state DC is applied through the resistor 62, and the combination provides sufficient forward bias to turn the gate-turn-on silicon controlled rectifier on. The current then will flow from the control winding 30 through the diode 35, the electronic switch 38, the diode 39 and to ground from there through the diode 31 back to the control winding 30. This AC short circuit current flow will overload and stop the oscillator 11. Also, the DC current will be established through the resistors 44 and 43 through the control winding 30, which then sets the magnetic flux in the core 12 of the transformer so as to be ready for the next cycle of spark signals when the oscillator 11 is turned on again.

While a particular embodiment of the invention has been described above in considerable detail in accordance with the applicable statutes, this is not to be taken as in any way limiting the invention but merely as being descriptive thereof.

I claim:

1. In combination with a high-frequency continuous-wave ignition system for an internal combustion engine, said system including a square wave oscillator employing a unitary magnetic circuit and including a control winding for starting and stopping said high-frequency continuous-wave energy to generate a continuous AC spark whenever said oscillator is oscillating, said system also including means for timing said AC spark duration intervals relative to said engine, the improvement comprising
   - a gate turn off type silicon controlled rectifier for applying a low impedance path to said control winding concurrently with a DC current therethrough between each said spark duration interval, and
   - said spark duration timing means comprising engine timed means for controlling the conductive state of a transistor,
   - a resistor and capacitor connected in parallel with one end connected to the gate of said gate controlled rectifier and the other end connected to said transistor for grounding that end when said transistor is conducting, and
   - circuit means for connecting said engine timed means to the base of said transistor.

2. In combination with a high-frequency continuous-wave ignition system for an internal combustion engine, said system including a square wave oscillator employing a unitary magnetic circuit and including a control winding for starting and stopping said high-frequency continuous-wave energy to generate a continuous AC spark whenever said oscillator is oscillating, said system also including means for timing said AC spark duration intervals relative to said engine, the improvement comprising
   - a gate turn off type silicon controlled rectifier for applying a low impedance path to said control winding concurrently with a DC current therethrough between each said spark duration interval,
   - said spark duration timing means comprising engine timed means for controlling the conductive state of a transistor, and
   - a resistor and capacitor connected between said transistor and the gate of said gate controlled rectifier,
   - said resistor and capacitor being connected in parallel with one end connected to said gate.

3. The invention according to claim 2, wherein
   - said spark duration timing means also comprises circuit means for connecting said engine timed means to the base of said transistor,
   - said transistor being connected to the other end of said parallel resistor and capacitor to ground same when said transistor is conducting.

* * * * *